United States Patent
Haiberger

(10) Patent No.: US 12,009,460 B2
(45) Date of Patent: Jun. 11, 2024

(54) METHOD FOR PRODUCING A CONVERSION ELEMENT, AND CONVERSION ELEMENT

(71) Applicant: Osram OLED GmbH, Regensburg (DE)

(72) Inventor: Luca Haiberger, Regensburg (DE)

(73) Assignee: Osram OLED GmbH, Regensburg (DE)

( * ) Notice: Subject to any disclaimer, the term of this patent is extended or adjusted under 35 U.S.C. 154(b) by 211 days.

(21) Appl. No.: 16/768,515

(22) PCT Filed: Dec. 5, 2018

(86) PCT No.: PCT/EP2018/083660
§ 371 (c)(1),
(2) Date: May 29, 2020

(87) PCT Pub. No.: WO2019/121020
PCT Pub. Date: Jun. 27, 2019

(65) Prior Publication Data
US 2020/0388729 A1   Dec. 10, 2020

(30) Foreign Application Priority Data
Dec. 19, 2017 (DE) .......................... 102017130574.2

(51) Int. Cl.
*H01L 33/50* (2010.01)
*H01L 33/00* (2010.01)
(Continued)

(52) U.S. Cl.
CPC ............ *H01L 33/505* (2013.01); *H01L 33/60* (2013.01); *H01L 2933/0041* (2013.01); *H01L 2933/0058* (2013.01)

(58) Field of Classification Search
CPC ....... H01L 33/60; H01L 33/48; H01L 33/486; H01L 33/52; H01L 2933/0058
See application file for complete search history.

(56) References Cited

U.S. PATENT DOCUMENTS

| 2008/0106186 | A1 | 5/2008 | Ishii et al. |
| 2009/0272985 | A1 | 11/2009 | Ishii et al. |

(Continued)

FOREIGN PATENT DOCUMENTS

| CN | 107275459 A | 10/2017 |
| CN | 107408608 A | 11/2017 |

(Continued)

OTHER PUBLICATIONS

International Search Report and Written Opinion issued in International Patent Application No. PCT/EP2018/083660 dated Mar. 4, 2019.

(Continued)

*Primary Examiner* — Antonio B Crite
(74) *Attorney, Agent, or Firm* — ArentFox Schiff LLP

(57) ABSTRACT

The invention relates to a method for producing a conversion element having the following steps: providing a frame having an opening; applying a sacrificial layer at least to a side surface of the at least one opening; applying a reflective layer to the sacrificial layer; introducing a conversion material into the at least one opening, the conversion material covering the reflective layer; and removing the sacrificial layer and the frame.

6 Claims, 7 Drawing Sheets

Figure 1A:
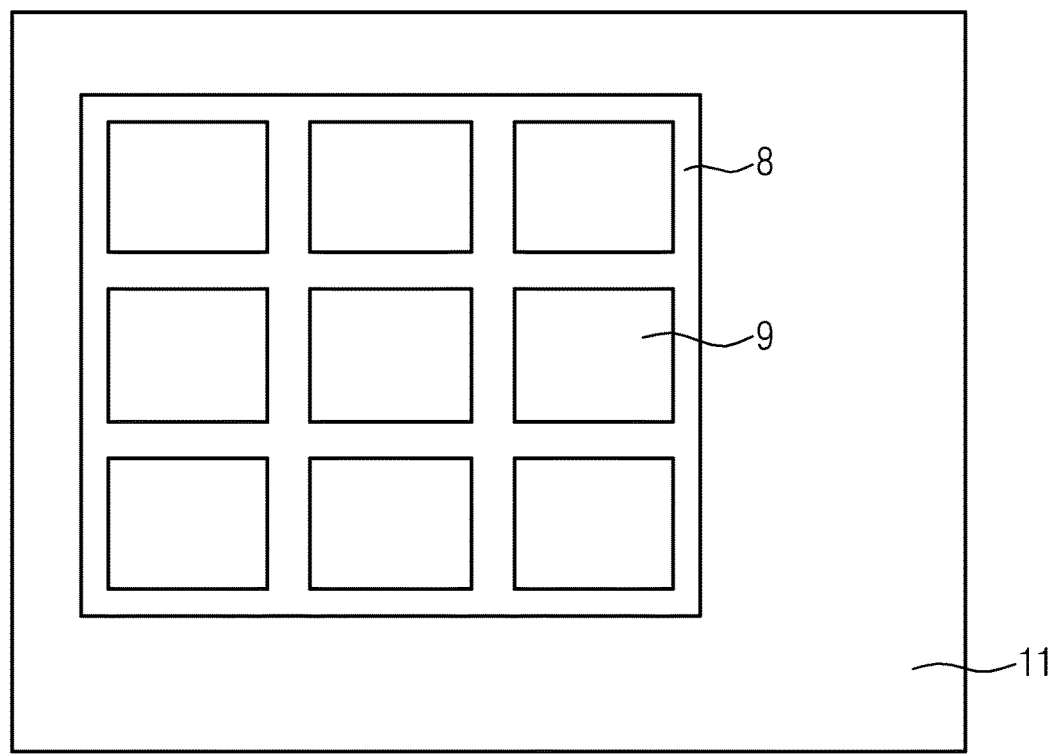

(51) Int. Cl.
    *H01L 33/46*       (2010.01)
    *H01L 33/48*       (2010.01)
    *H01L 33/52*       (2010.01)
    *H01L 33/60*       (2010.01)

(56) References Cited

U.S. PATENT DOCUMENTS

| | | | | |
|---|---|---|---|---|
| 2011/0284902 A1 | * | 11/2011 | Daicho | H01L 33/505 |
| | | | | 257/E33.061 |
| 2013/0032842 A1 | | 2/2013 | Park et al. | |
| 2015/0311405 A1 | | 10/2015 | Oyamada et al. | |
| 2017/0263837 A1 | | 9/2017 | Jeon et al. | |

FOREIGN PATENT DOCUMENTS

| | | | | |
|---|---|---|---|---|
| DE | 102012110957 A1 | 5/2014 | | |
| DE | 102014102293 A1 | 8/2015 | | |
| EP | 2363896 A1 | 9/2011 | | |
| JP | 2016536804 A | 11/2016 | | |
| KR | 20160055880 A * | 5/2016 | | H01L 25/075 |
| WO | 2010061592 A1 | 6/2010 | | |
| WO | 2014091914 A1 | 6/2014 | | |
| WO | 2015/036887 A1 | 3/2015 | | |
| WO | WO-2016039593 A1 * | 3/2016 | | G01J 3/501 |
| WO | 2017/023502 A1 | 2/2017 | | |
| WO | WO-2017080461 A1 * | 5/2017 | | H01L 33/60 |

OTHER PUBLICATIONS

Office Action in JP2020533788, dated Jan. 17, 2023, 2 pages.
Office Action in CN201880081839.9, dated Feb. 11, 2023, 12 pages.

\* cited by examiner

METHOD FOR PRODUCING A CONVERSION ELEMENT, AND CONVERSION ELEMENT

This application is a 35 U.S.C. § 371 National Phase of PCT Application No. PCT/EP2018/083660, filed Dec. 5, 2018, which claims priority to German Application No. 10 2017 130 574.2, filed Dec. 19, 2017, the disclosures of which are hereby incorporated by reference herein.

A method for producing a conversion element is specified. Furthermore, a conversion element is specified. Furthermore, a method for producing an optoelectronic semiconductor component and an optoelectronic semiconductor component are specified.

One object to be achieved is to specify a method by which a conversion element is producible in a cost-effective manner. A further object to be achieved is to specify such a conversion element.

A method for producing a conversion element is specified. The conversion element is configured to convert primary radiation into secondary radiation of longer wavelength, for example. For this purpose, it comprises particles of a luminescence conversion material, for example.

In accordance with at least one embodiment, the method comprises providing a frame having an opening. The frame can have one or a plurality of openings, for example. If the frame has a plurality of openings, then the latter can be arranged for example in a matrixlike manner, that is to say in a manner arranged along rows and columns, in one plane. That is to say that the openings can be arranged at grid points of a regular grid, for example.

The at least one opening can have a rectangular, a polygonal, a round or an oval shape, for example. By way of example, the at least one opening completely penetrates through the frame, that is to say that the at least one opening perforates the frame.

The frame is formed from a hard material, for example. In this case, a hard material is a material that deforms or is damaged only slightly under mechanical loading and maintains the shape originally provided. The frame is formed for example with or from a plastic or with or from a metal.

In accordance with at least one embodiment, the method comprises the step of applying a sacrificial layer at least to a side surface of the at least one opening. The at least one side surface of the at least one opening links a top surface of the frame to the bottom surface thereof. If the at least one opening has a plurality of side surfaces, for example, the latter are arranged in one plane.

A material of the sacrificial layer is formed from a photoresist, for example. A photoresist from which structures with a comparatively high aspect ratio can be produced is preferably used in this case. In particular, conversion elements having a large thickness can be obtained with these photoresists. By way of example, the photoresist is a negative resist formed from SU-8, for example.

The material of the sacrificial layer is filled into the at least one opening, for example. An auxiliary carrier is arranged at an underside of the frame, for example. A bottom surface of the opening is then formed by a top surface of the auxiliary carrier, for example. A bottom surface and a top surface of the material of the sacrificial layer then terminate flush with the bottom surface and the top surface of the frame, for example. The material of the sacrificial layer covers the at least one side surface of the at least one opening and is for example in direct and immediate contact with the at least one side surface of the at least one opening. That is to say that the material of the sacrificial layer can cover the top surface of the auxiliary carrier in addition to the at least one side surface of the opening and can be in direct and immediate contact with said top surface. The at least one side surface is completely covered by the material of the sacrificial layer, for example.

The material of the sacrificial layer is filled only into the at least one opening, for example, such that the top surface of the frame is substantially free of the material of the sacrificial layer. Substantially free means that small amounts of the material of the sacrificial layer can be present at the top surface of the frame on account of production tolerances.

If the frame has a plurality of openings, the openings have in the same way side surfaces that are completely covered in each case by the material of the sacrificial layer.

A cutout, for example, can be produced into a part of the material of the sacrificial layer. Said cutout is produced by material removal of the material of the sacrificial layer, for example. The material removal can be produced by chemical etching, for example. The cutouts penetrate completely through the material of the sacrificial layer, for example, that is to say that the material of the sacrificial layer is then completely removed and is perforated by the cutout. That is to say that the cutout is produced for example as far as the top surface of the auxiliary carrier and the top surface of the auxiliary carrier is free of the material of the sacrificial layer, for example. Only the material of the sacrificial layer on the at least one side surface of the at least one opening remains and forms a sacrificial layer.

If the material of the sacrificial layer is formed by a photoresist, for example, then the photoresist can be patterned by photolithography. By means of chemical etching, for example, the photoresist is removed at the patterned locations, such that only a thin layer of the photoresist remains on at least one side surface of the at least one opening. Said thin layer then forms the sacrificial layer on the at least one side surface of the at least one opening.

Alternatively, it is possible to apply a thin layer of the material of the sacrificial layer into the at least one opening. The at least one opening is then only partly filled, for example. By way of example, the at least one side surface and the at least one bottom surface of the at least one opening are then covered with a thin film of the material of the sacrificial layer. The material of the sacrificial layer is in direct and immediate contact with the at least one side surface of the at least one opening, for example. The material of the sacrificial layer adjoining the bottom surface of the at least one opening, for example, can be removed by chemical etching, for example. Only the material of the sacrificial layer on the at least one side surface of the at least one opening remains in this case and forms the sacrificial layer.

In accordance with at least one embodiment, the method comprises the step of applying a reflective layer to the sacrificial layer. The reflective layer covers for example the outer surfaces of the sacrificial layer facing away from the frame. The reflective layer is for example in direct and immediate contact with the outer surfaces of the sacrificial layer facing away from the frame. Furthermore, the reflective layer can cover for example the top surface of the frame and the at least one bottom surface of the at least one opening. That is to say that the reflective layer covers the top surface of the auxiliary carrier, for example. After the reflective layer has been applied, the auxiliary carrier can be removed again, for example.

The reflective layer is a metallic reflective layer, for example. That is to say that the reflective layer consists of or contains a metal. The reflective layer can be applied for example by means of a deposition process from a top side of the frame. The deposition can be effected for example by means of one of the following methods: sputtering, PVD, vapor deposition.

The reflective layer comprises for example one or more of the following materials or consists of one or more of these materials: Ag, Al, Al:Cu, Rh, Pd, Pt, TCO layer such as ITO. Furthermore, the reflective layer can also be embodied as a dielectric mirror comprising layers of silver and silicon oxide, for example. A thickness of the reflective layer is for example at least 10 nm or 50 nm and/or at most 100 nm or 500 nm. Advantageously, this metallic reflective layer is thinner than for example a reflective layer formed from silicone and TiO2.

In accordance with at least one embodiment, the method comprises the step of introducing a conversion material into the at least one opening, wherein the conversion material covers the reflective layer. The conversion material converts for example electromagnetic radiation into electromagnetic radiation in a different wavelength range. The conversion material comprises for example a matrix material into which phosphor particles are introduced. The matrix material can be for example a resin such as, for instance, an epoxy or a silicone or a mixture of these materials. The phosphor particles impart the wavelength-converting properties to the conversion material and thus to the conversion element.

By way of example, one of the following materials is suitable for the phosphor particles: garnets doped with rare earths, alkaline earth metal sulfides doped with rare earths, thiogallates doped with rare earths, aluminates doped with rare earths, silicates doped with rare earths, orthosilicates doped with rare earths, chlorosilicates doped with rare earths, alkaline earth metal silicon nitrides doped with rare earths, oxynitrides doped with rare earths, aluminum oxynitrides doped with rare earths, silicon nitrides doped with rare earths, sialons doped with rare earths, quantum dots. These materials can also be used and applied directly without a matrix material. The conversion element can then consist of one of the materials.

The conversion material is introduced into the at least one opening. In this case, the conversion material is present in a flowable form, for example. In this case, the conversion material is cured after being applied. Furthermore, the conversion material can be applied by means of spraying, screen printing or blade coating, for example.

The conversion material completely covers the reflective layer in the at least one opening, for example. That is to say that the bottom surface of the at least one opening which is formed from the reflective layer is covered by the conversion material. In addition, the at least one side surface of the at least one opening which is covered by the reflective layer is covered by the conversion material. The conversion material is in direct and immediate contact with the reflective layer, for example. A bottom surface and a top surface of the conversion material terminate flush with a top surface and a bottom surface of the reflective material, for example.

In accordance with at least one embodiment, the method comprises the step of removing the sacrificial layer and the frame. As a result of removing the sacrificial layer and the frame, the at least one conversion element is singulated. The conversion element thus produced comprises a reflective layer, which completely covers the at least one side surface of the conversion element, in particular all side surfaces of the conversion element. The at least one side surface of the conversion element links a top surface of the conversion element to the bottom surface thereof. The conversion element can then be applied to a surface-emitting, radiation-emitting semiconductor chip, for example. Furthermore, a multiplicity of conversion elements are producible by a method described here.

In at least one embodiment, the method for producing a conversion element comprises the steps of providing a frame having an opening, applying a sacrificial layer to at least one side surface of the at least one opening, applying a reflective layer to the sacrificial layer, introducing a conversion material into the at least one opening, wherein the conversion material covers the reflective layer, and removing the sacrificial layer and the frame.

The method for producing a conversion element as described here makes use then of the concept, inter alia, that a thin, metallic, reflective layer surrounds the side surfaces of a conversion element in order thus to minimize the side emissions.

Alternatively, the side surfaces of conversion elements into which a radiation-emitting semiconductor chip can also be embedded can be surrounded with a reflective layer formed from silicone and TiO2. In order that a high reflectivity is achieved, the thickness of said reflective layer must be more than 200 μm. Said thickness limits the distance between radiation-emitting components in a matrix arrangement, that is to say arranged along rows and columns.

One concept of the method described here for producing a conversion element and of the method for producing an optoelectronic semiconductor component is, inter alia, replacing the reflective layer formed from silicone and TiO2 by a thin, metallic, reflective layer. For the optoelectronic semiconductor components produced in this way, for example, volume-emitting flip-chips can be used, for example, wherein the resulting optoelectronic semiconductor components are surface emitting. As a result of the thin, reflective, metallic layer having a thickness of at least 5 nm and at most 50 nm, for example, the optoelectronic semiconductor components have smaller dimensions than for example chip scale packages (CSPs) in which the reflective layer is formed from a silicone containing TiO2 particles. In the case of CSPs, the packages are of the order of magnitude of the semiconductor chips used. The use of the metallic layer is advantageous for example in flash matrix arrangements, for example for flashlights having a pixelated LED chip. Furthermore, the use of the metallic layer is advantageous for adaptive front lighting systems, for example for headlights of motor vehicles. Furthermore, the metallic reflective layers minimize optical crosstalk between adjacent optoelectronic semiconductor components. Moreover, the optoelectronic semiconductor components can be produced by a batch process, resulting in low process costs.

In accordance with at least one embodiment, a side surface of the at least one opening has a chamfer. The at least one oblique side surface of the at least one opening runs transversely with respect to the top surface of the frame. The at least one oblique side surface forms for example an acute angle with the top surface of the frame. Moreover, the at least one oblique side surface of the at least one opening is embodied in a planar fashion. If the at least one opening has a plurality of side surfaces, the latter likewise have the chamfer, for example. It is possible, for example, for at least two mutually opposite side surfaces to have the chamfer.

Moreover, it is possible for at least two adjoining side surfaces to have the chamfer.

The conversion element thus produced can have for example a widening shape in the direction of the bottom surface. That is to say that the cross-sectional area of the top surface of the conversion element in lateral directions is smaller than the cross-sectional area of the bottom surface of the conversion element in lateral directions. By way of example, a focused light emission characteristic can be achieved by means of this shape.

Alternatively, it is possible for the conversion element to have a widening shape in the direction of the top surface of the conversion element. That is to say that the cross-sectional area of the top surface of the conversion element in the lateral direction of the conversion element is larger than the cross-sectional area of the bottom surface of the conversion element. By way of example, the coupling out of light can be increased by means of this shape.

The sacrificial layer applied to at least one side surface of the at least one opening then likewise has a chamfer. That is to say that the applied sacrificial layer likewise runs transversely with respect to the top surface of the frame and forms an acute angle with the top surface of the frame.

Moreover, the reflective layer applied on the sacrificial layer likewise has a chamfer. That is to say that the applied reflective layer likewise runs transversely with respect to the top surface of the frame and forms an acute angle with the top surface of the frame.

Furthermore, a method for producing an optoelectronic semiconductor component is specified.

In accordance with at least one embodiment, the method comprises the described steps for producing a conversion element.

In accordance with at least one embodiment, the method comprises the step in which, before introducing the conversion material, a radiation-emitting semiconductor chip is introduced into the at least one opening. The radiation-emitting semiconductor chip can be a so-called volume emitter, for example. A volume-emitting, radiation-emitting semiconductor chip comprises a substrate, on which for example a semiconductor body is grown or applied epitaxially. The substrate can for example comprise one of the following materials or consist of one of the following materials: sapphire, silicon carbide, glass. Volume-emitting, radiation-emitting semiconductor chips emit the generated radiation not only via a single light exit surface, but also via their side surfaces. For example, in a volume emitter, at least 30% of the emitted radiation emerges through the side surfaces. By way of example, the radiation-emitting semiconductor chip can be a light-emitting diode chip embodied as a flip-chip.

The radiation-emitting semiconductor chip comprises contact elements at a bottom surface of the semiconductor body, for example, said contact elements being provided for example for the electrical contacting of the radiation-emitting semiconductor chip. A top surface of the semiconductor body is free of contact elements, for example. The bottom surface and the top surface of the semiconductor body run parallel in vertical directions and perpendicularly to a vertical direction.

The frame is positioned on a further auxiliary carrier for example before introducing the at least one radiation-emitting semiconductor chip. The further auxiliary carrier can comprise a film for example at a top side, said film forming adhesion forces. The bottom surface of the at least one opening is then formed by the top surface of the auxiliary carrier, for example. The at least one radiation-emitting semiconductor chip is introduced for example centrally into one of the at least one opening. The adhesion forces formed between the film and the at least one radiation-emitting semiconductor chip, for example, promote adhesion between these two component parts. That is to say that the radiation-emitting semiconductor chip is connected to the auxiliary carrier and cannot slip. In this case, by way of example, a bottom surface of the semiconductor body terminates flush with the bottom surface of the reflective layer. Moreover, the reflective layer projects beyond the top side of the semiconductor body in a vertical direction.

The frame then laterally surrounds the at least one radiation-emitting semiconductor chip. In particular, the frame can completely laterally enclose the at least one radiation-emitting semiconductor chip.

In accordance with at least one embodiment, the conversion material introduced partly surrounds the radiation-emitting semiconductor chip. The top surface and the bottom surface of the conversion material terminate flush with the top surface and the bottom surface of the reflective layer, for example. The conversion material completely covers the top surface of the semiconductor body and the side surfaces of the semiconductor body, for example. The conversion material here is in direct and immediate contact with the top surface and the side surfaces of the semiconductor chip and also the at least one side surface of the reflective layer. That is to say that if a volume-emitting semiconductor chip is used, for example, then the electromagnetic primary radiation which is emitted during operation and which emerges from the side surfaces of the semiconductor body and from the top surface of the semiconductor body is converted to secondary radiation. By means of the reflective layer, the electromagnetic primary and secondary radiation emerging from the side surfaces of the semiconductor body is reflected again and once again enters the conversion material. The remaining primary radiation is once again converted there. Furthermore, the primary radiation and secondary radiation are directed in the direction of the top surface of the semiconductor body, for example, by means of the reflective layer. This advantageously increases the coupling out of light.

Furthermore, a conversion element is specified. Preferably, the conversion element is produced by the method for producing a conversion element as described above here. That is to say that a conversion element described here is producible by the method described here or is produced by the method described. Therefore, all features disclosed in connection with the method for producing a conversion element are also disclosed in connection with the conversion element, and vice versa.

In accordance with at least one embodiment, the conversion element comprises a conversion material. The conversion material converts electromagnetic radiation into electromagnetic radiation in a different wavelength range, for example. The conversion material comprises for example a matrix material into which phosphor particles are introduced. The matrix material can be for example a resin such as, for instance, an epoxy or a silicone or a mixture of these materials. The phosphor particles impart the wavelength-converting properties to the conversion material and thus to the conversion element.

In accordance with at least one embodiment, the conversion material comprises a reflective layer. The reflective layer is a metallic reflective layer, for example. That is to say that the reflective layer consists of or contains a metal. The reflective layer comprises for example one or more of the following materials or consists of one or more of these materials: Ag, Al, Al:Cu, Rh, Pd, Pt, TCO layer such as ITO.

Furthermore, the reflective layer can also be embodied as a dielectric mirror comprising layers of silver and silicon oxide, for example. A thickness of the reflective layer is for example at least 10 nm or 20 nm or 30 nm and/or at most 100 nm or 200 nm or 500 nm.

In accordance with at least one embodiment, the reflective layer is in direct contact with a side surface of the conversion material. That is to say that a side surface of the reflective layer facing the conversion material is in direct and immediate contact with the at least one side surface of the conversion material. Advantageously, the electromagnetic radiation and the converted electromagnetic radiation are reflected back into the conversion material directly at the interface between the conversion material and the reflective layer and the remaining electromagnetic radiation can be converted once again. By way of example, losses resulting from scattering at a layer arranged between the conversion material and the reflective layer are avoided as a result of the direct contact.

In accordance with at least one embodiment, an outer surface of the reflective layer facing away from the conversion material forms an exposed outer surface of the conversion element. The arrangement of conversion material and reflective layer thus forms the conversion element. Furthermore, the outer surface of the reflective layer facing away from the conversion material is freely accessible. Advantageously, such a conversion element is handlable particularly simply.

In accordance with at least one embodiment, the reflective layer completely covers the at least one side surface of the conversion material. That is to say that for example a top surface of the conversion material terminates flush with a top surface of the reflective layer and a bottom surface of the conversion material terminates flush with a bottom surface of the reflective layer. That is to say that electromagnetic radiation and converted electromagnetic radiation are reflected at the entire side surface of the conversion element.

In accordance with at least one embodiment, the reflective layer has a constant thickness. In this case, the thickness of the reflective layer is the distance between for example two mutually opposite inner surfaces of the reflective layer in lateral directions. This distance in lateral directions is constant for different positions in a vertical direction. By way of example, the thickness of the reflective layer is substantially identical within the scope of production tolerance. In this case, substantially identical means that small unevennesses on account of production tolerances for example may lead to a variation of the thickness of the reflective layer.

In accordance with at least one embodiment, the conversion material has a widening shape in the direction of a bottom surface or a top surface of the conversion element. If the conversion material has a widening shape in the direction of the bottom surface, for example, then the cross-sectional area of the top surface of the conversion material in lateral directions is smaller than the cross-sectional area of the bottom surface of the conversion material in lateral directions. By way of example, a focused light emission characteristic can be achieved by means of this shape.

If the conversion material has a widening shape in the direction of the top surface of the conversion element, then the cross-sectional area of the top surface of the conversion material in a lateral direction of the conversion material is larger than the cross-sectional area of the bottom surface of the conversion material. By way of example, the coupling out of light can be increased by means of this shape.

Furthermore, an optoelectronic semiconductor component is specified. Preferably, the optoelectronic semiconductor component is produced by the method described above here for producing an optoelectronic semiconductor component. That is to say that an optoelectronic semiconductor component described here is producible by the method described here or is produced by the method described. Therefore, all features disclosed in connection with the method for producing an optoelectronic semiconductor component are also disclosed in connection with the optoelectronic semiconductor component, and vice versa.

In accordance with at least one embodiment, the optoelectronic semiconductor component comprises a conversion element described here. That is to say that, therefore, all features disclosed in connection with the conversion element are also disclosed in connection with the optoelectronic semiconductor component, and vice versa.

In accordance with at least one embodiment, the optoelectronic semiconductor component comprises a radiation-emitting semiconductor chip. The radiation-emitting semiconductor chip can be a so-called volume emitter, for example. A volume-emitting, radiation-emitting semiconductor chip comprises a substrate, on which for example a semiconductor body is grown or applied epitaxially. Volume-emitting, radiation-emitting semiconductor chips emit the generated radiation not only via a single light exit surface but also via their side surfaces. For example, in the case of the volume emitter, at least 30% of the emitted radiation emerges through the side surfaces. By way of example, the radiation-emitting semiconductor chip can be a light-emitting diode chip embodied as a flip-chip.

In accordance with at least one embodiment, the radiation-emitting semiconductor chip is embedded into the conversion element. In this case, embedded can mean that the radiation-emitting semiconductor chip is arranged partly within the conversion element and/or is enclosed by the conversion element at at least one part of its outer surface. In this case, the radiation-emitting semiconductor chip is in direct and immediate contact with the conversion element, for example. That is to say that in places material of the conversion element directly adjoins the semiconductor chip.

In accordance with at least one embodiment, the radiation-emitting semiconductor chip comprises a semiconductor body configured for generating electromagnetic primary radiation. The semiconductor body is an epitaxially grown semiconductor body, for example. The semiconductor body can be based on a III-V compound semiconductor material. The semiconductor body comprises an active region comprising a quantum well structure or a multiple quantum well structure. In this case, the active region is configured to generate the electromagnetic primary radiation.

In accordance with at least one embodiment, a contact element is arranged at an underside of the radiation-emitting semiconductor chip. In this case, the contact elements are configured for energizing the semiconductor body. The contact elements comprise or consist of a metal, for example. A top surface of the contact elements terminates flush with a bottom surface of the conversion element, for example.

In accordance with at least one embodiment, the conversion material covers a side surface of the semiconductor body. That is to say that the conversion material projects beyond a cross-sectional area of the semiconductor body in lateral directions, for example. That is to say that if the radiation-emitting semiconductor chip is a volume emitter, for example, then the primary radiation which is emitted during the operation of the optoelectronic component and which emerges through the at least one side surface of the semiconductor body is advantageously converted as well.

In accordance with at least one embodiment, the conversion material covers a top surface of the semiconductor body. The conversion material projects beyond the top surface of the semiconductor body in a vertical direction in the direction of the top surface of the conversion material. That is to say that the primary radiation which is emitted during the operation of the optoelectronic component and which emerges from the top surface of the semiconductor body is converted.

In addition, a bottom surface of the conversion material terminates flush with a bottom surface of the semiconductor body, for example. That is to say that a side surface of the contacts is not covered by the conversion material. Furthermore, the bottom surface of the semiconductor body is also free of the conversion material, for example.

In accordance with at least one embodiment, the conversion material is in direct contact with the at least one side surface and the top surface of the semiconductor body. That is to say that a side surface of the conversion material facing away from the reflective layer is for example in direct and immediate contact with the at least one side surface of the semiconductor body facing the reflective layer and covers the latter completely. Furthermore, the conversion material is for example in direct and immediate contact with the top surface of the semiconductor body.

In accordance with at least one embodiment, the reflective layer is configured to reflect a part of the electromagnetic primary radiation. The reflective layer is a metallic reflective layer, for example. That is to say that the reflective layer consists of or contains a metal.

Furthermore, it is possible for the reflective layer to be a Bragg mirror consisting of alternately arranged layers of a high refractive index material and a low refractive index material. The reflective layer is then configured in an electrically insulating fashion, for example.

Furthermore, the reflective layer can be a combination of a Bragg mirror and a metallic layer.

In this case, the reflective layer preferably has a reflectivity of at least 90% for electromagnetic primary radiation generated in the active region.

The method for producing a conversion element and also the conversion element described here are explained in greater detail below on the basis of exemplary embodiments and with reference to the associated figures.

Figure 1B:
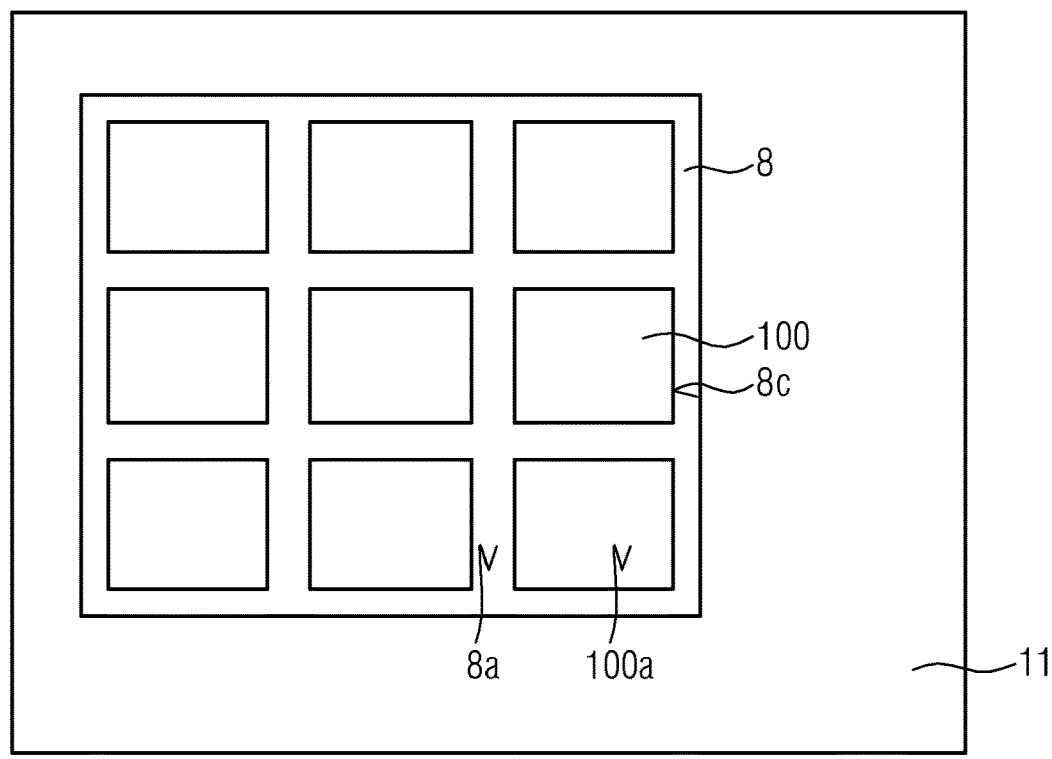
Figure 1C:
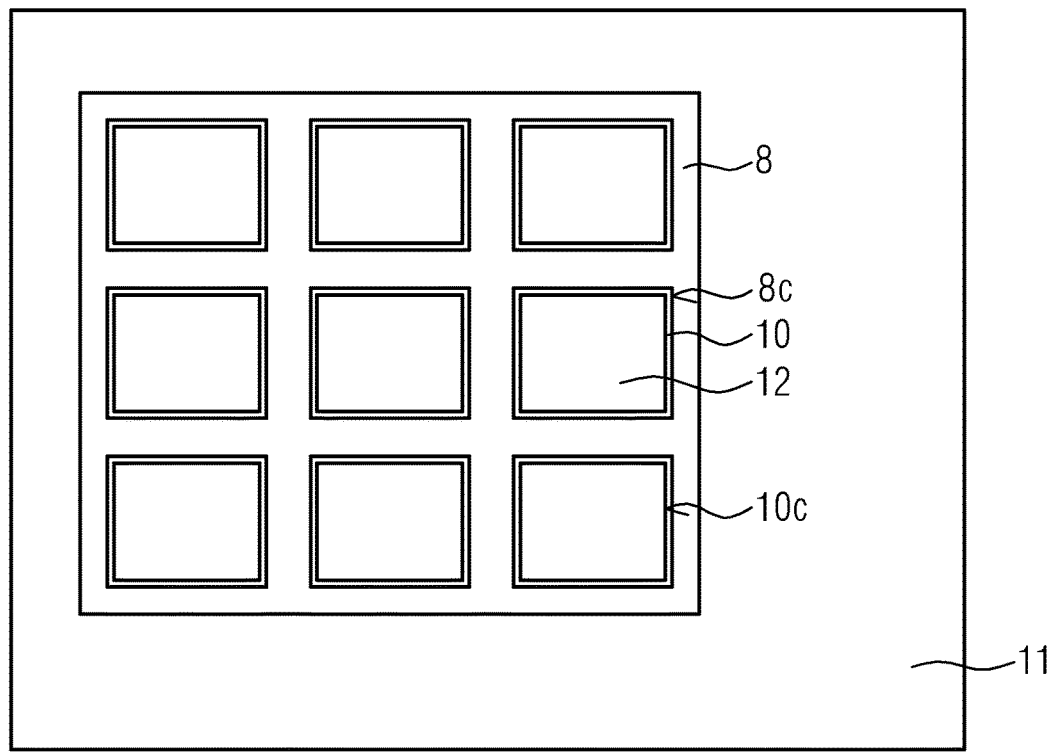
Figure 1D:
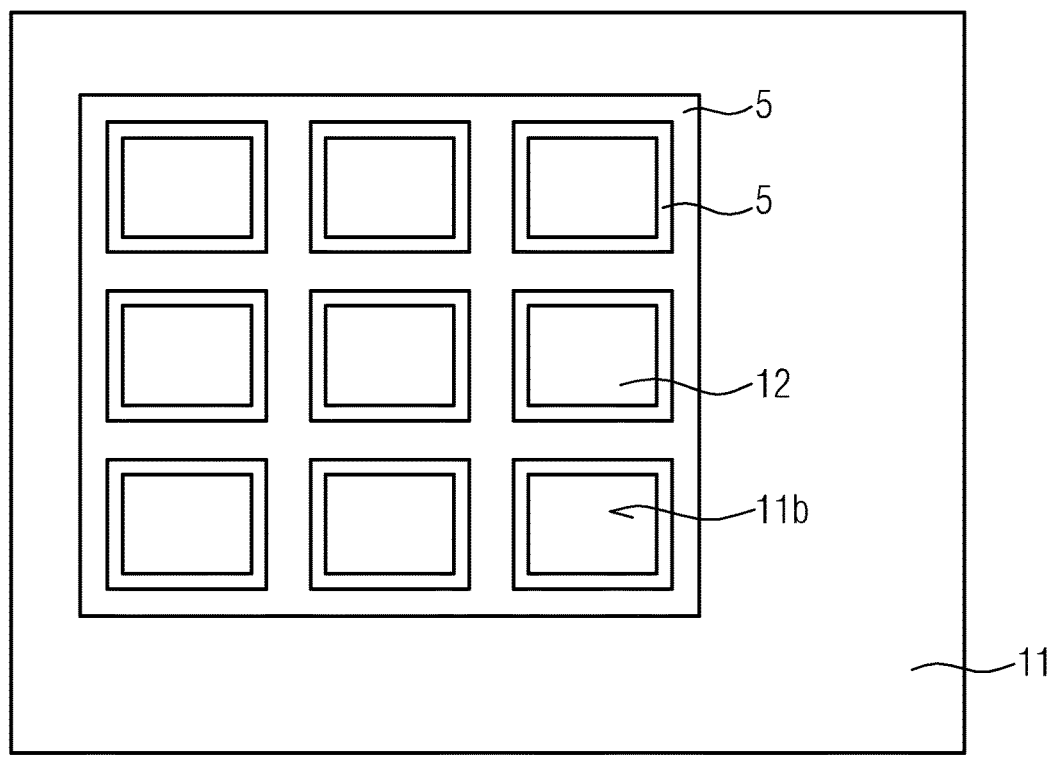
Figure 1E:
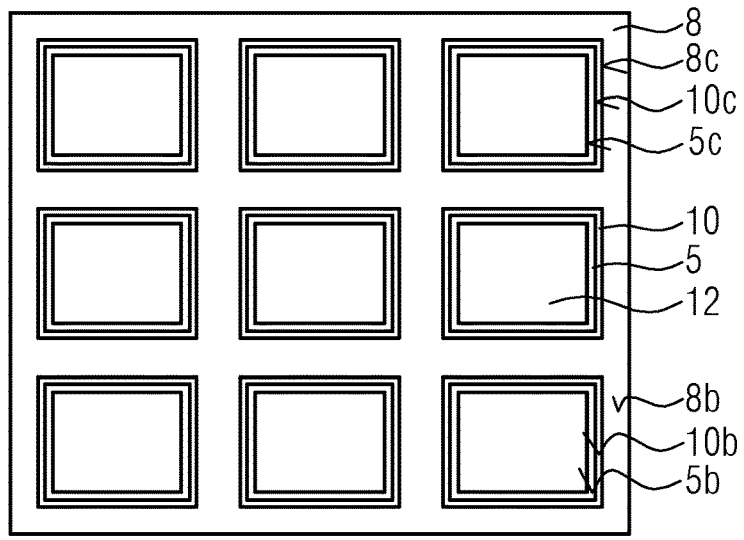
Figure 1F:
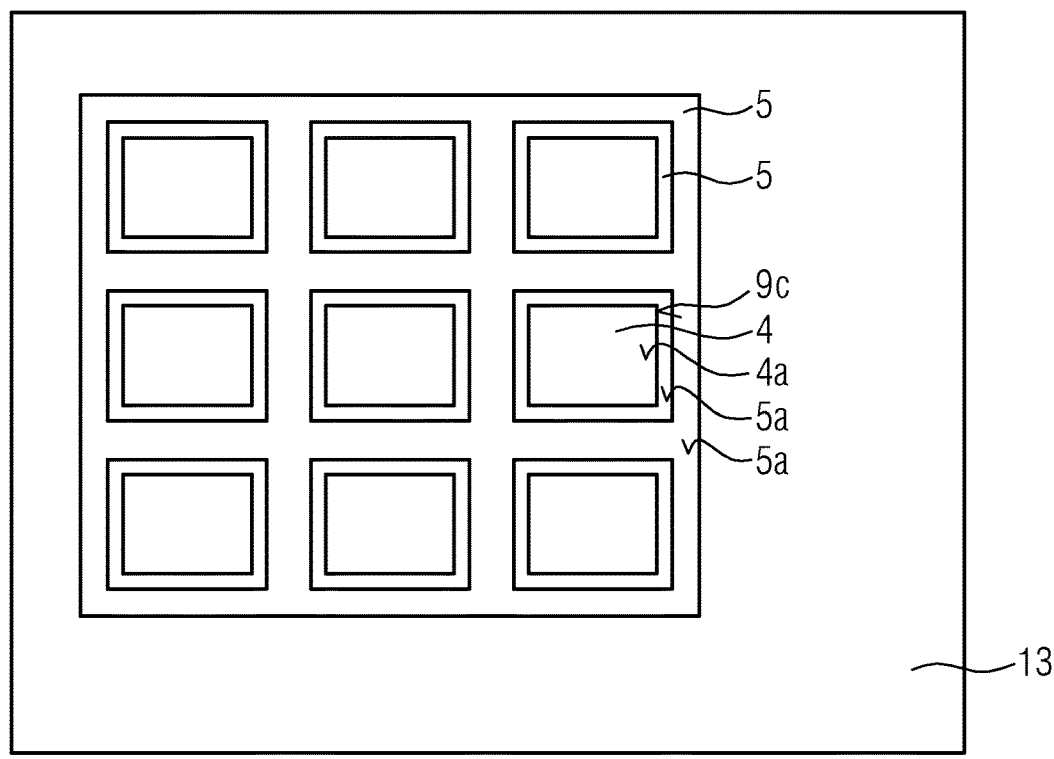
Figure 1G:
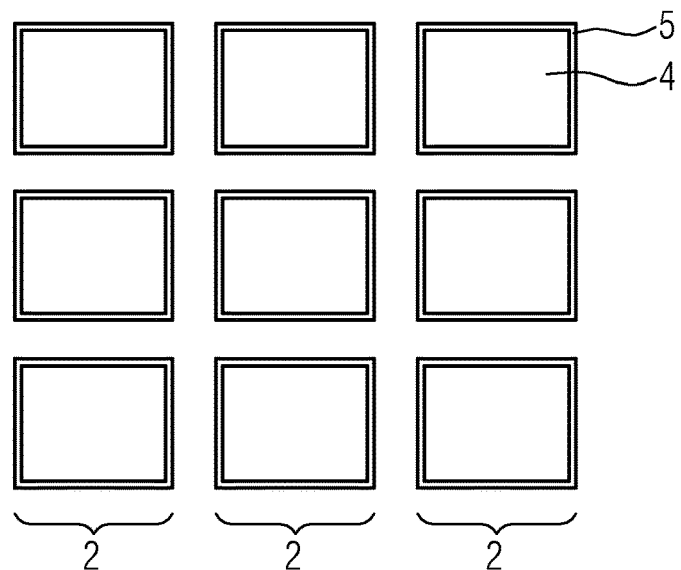
Figure 2:
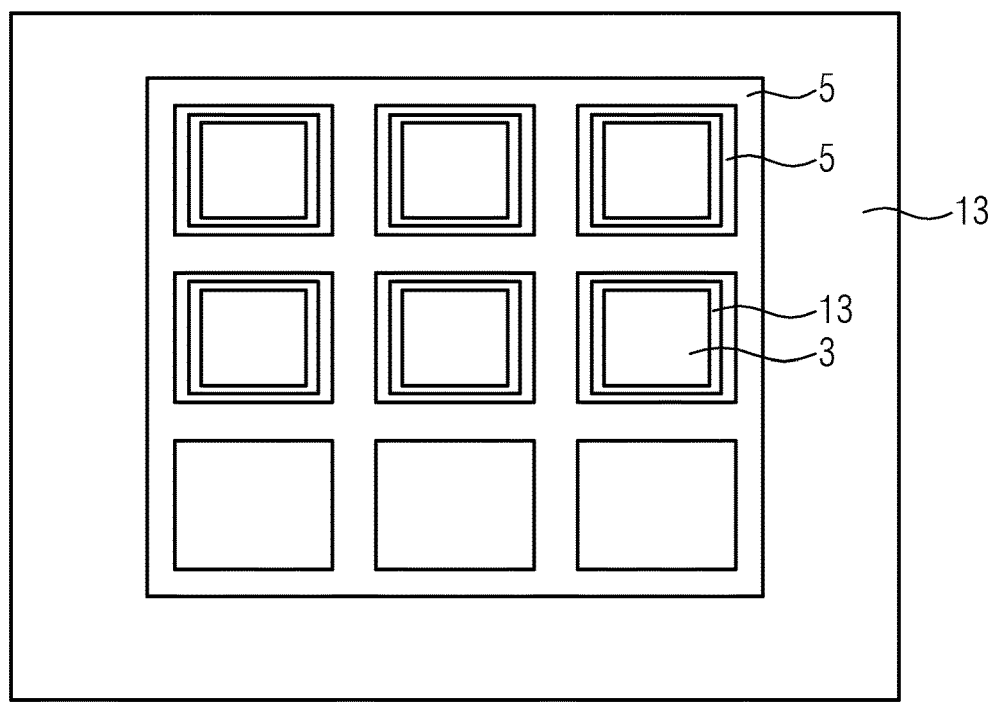
Figure 3:
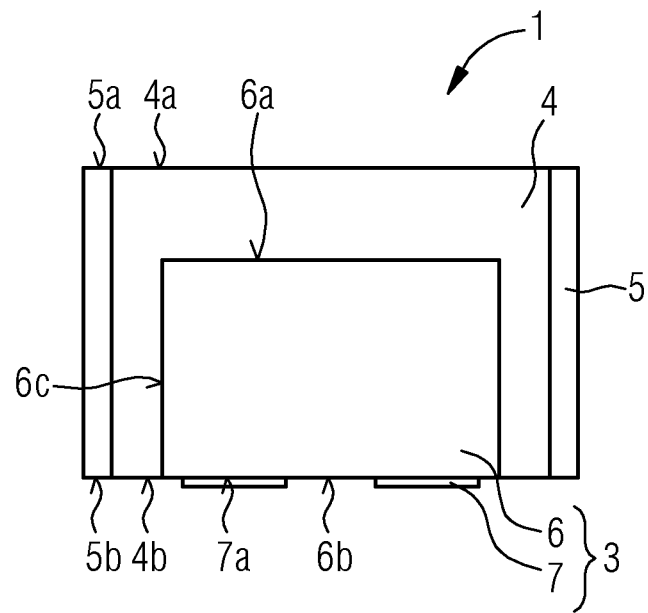
Figure 4:
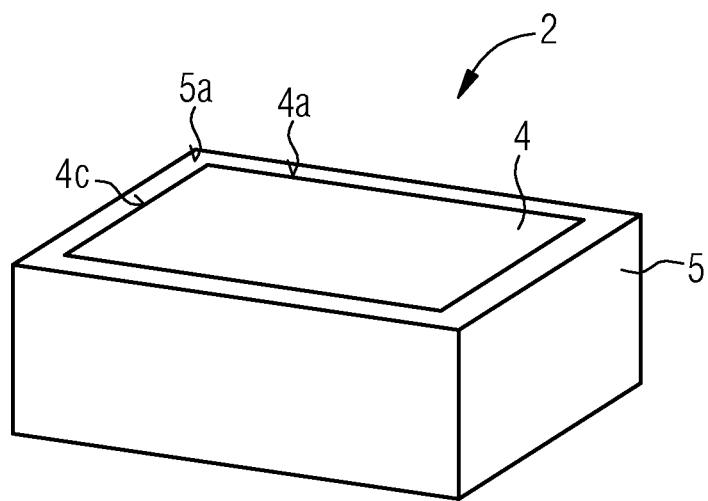
Figure 5:
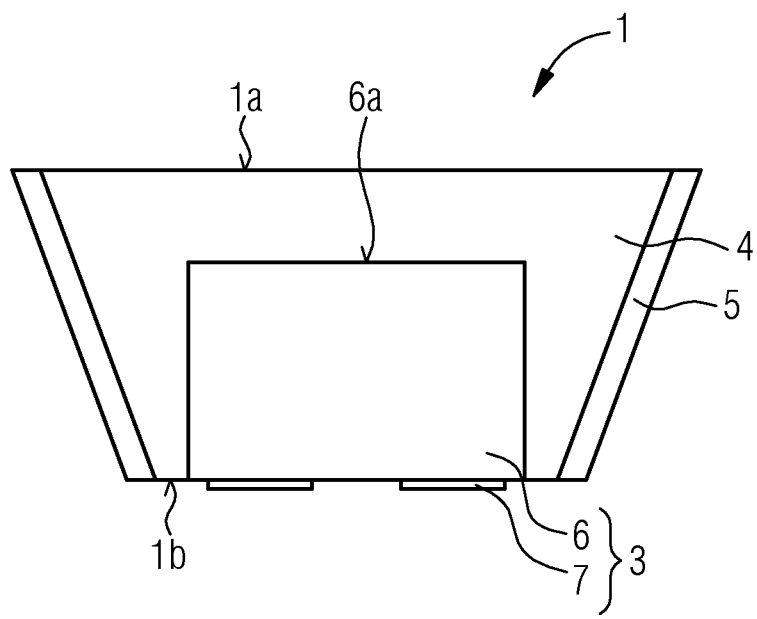
Figure 6A:
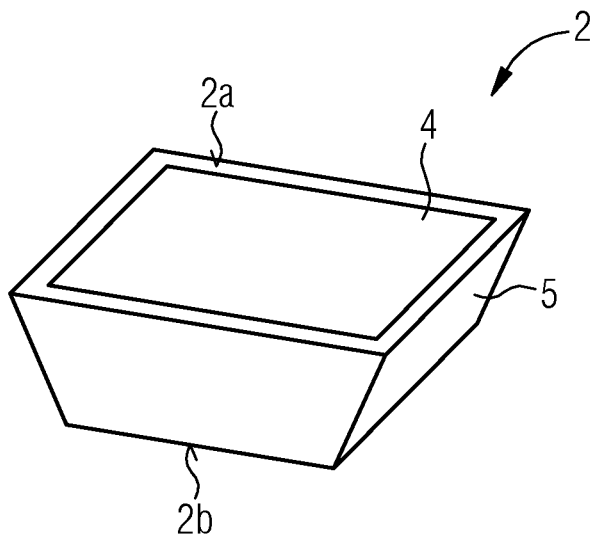
Figure 6B:
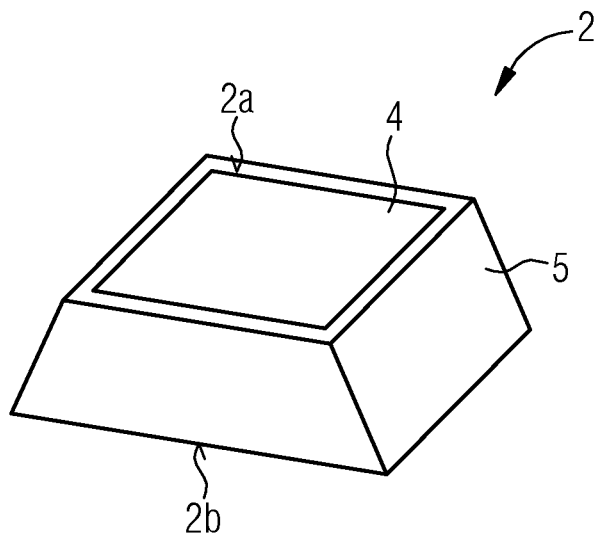
Figure 7:
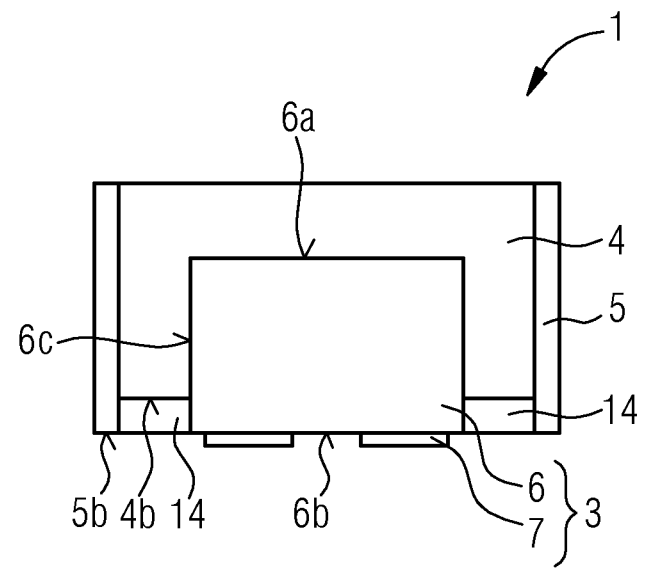

In the figures:

FIGS. 1A, 1B, 1C, 1D, 1E, 1F and 1G: show schematic sectional illustrations of method steps of one exemplary embodiment of a conversion element, FIG. 2: shows a schematic sectional illustration in plan view of a method step of one exemplary embodiment of a method described here for producing an optoelectronic semiconductor component, FIG. 3: shows a schematic sectional illustration of one exemplary embodiment in side view of an optoelectronic semiconductor component described here, FIG. 4: shows a schematic illustration of one exemplary embodiment of a conversion element described here, FIG. 5: shows a schematic sectional illustration of one exemplary embodiment in side view of an optoelectronic semiconductor component described here, FIGS. 6A and 6B: show schematic illustrations of exemplary embodiments of a conversion element described here, FIG. 7: shows a schematic sectional illustration of one exemplary embodiment in side view of an optoelectronic semiconductor component described here.

Elements that are identical, of identical type or act identically are provided with the same reference signs in the figures. The figures and the size relationships of the elements illustrated in the figures among one another should not be regarded as to scale. Rather, individual elements may be illustrated with an exaggerated size in order to enable better illustration and/or in order to afford a better understanding.

One exemplary embodiment of a production method for conversion elements 2 described here is illustrated in association with FIGS. 1A to 1G.

In accordance with FIG. 1A, in a first method step, a frame 8 having a multiplicity of openings 9 is provided. The openings 9 here completely penetrate through the frame 8 and are arranged in a matrix-like fashion, that is to say in a manner arranged along rows and columns, in one plane. That is to say that the openings 9 can be arranged at grid points of a regular grid, for example. An underside of the frame can be arranged on a top side of an auxiliary carrier 11, for example.

In accordance with FIG. 1B, in a next method step, the openings 9 are filled with a material of the sacrificial layer 100. Here the material of the sacrificial layer 100 is a photoresist, for example. In this case, a top surface of the material of the sacrificial layer 100a terminates flush with a top surface of the frame 8a. That is to say that the complete opening 9 is filled with the material of the sacrificial layer 100. In this case, the material of the sacrificial layer 100 is in direct and immediate contact with the side surfaces of the frame 8c.

In accordance with FIG. 1C, in a next method step, a multiplicity of cutouts 12 are produced into the sacrificial layer 10. The material removal is produced here for example by photolithography and chemical etching of the top surface of the material of the sacrificial layer 100. The cutouts 12 completely penetrate through the material of the sacrificial layer 100 in this case. The remaining material of the sacrificial layer 100 here completely covers the side surfaces of the frame 8c and is in direct and immediate contact with them. That is to say that the material of the sacrificial layer 100 corresponds to a sacrificial layer 10.

In accordance with FIG. 1D, in a next method step, by means of a deposition process, for example sputtering, a reflective layer 5 is applied to the top surface of the frame 8a, a top surface of the sacrificial layer and a side surface of the sacrificial layer 10c. A bottom surface of the auxiliary carrier 11b is also covered with the reflective layer 5 by means of the deposition process. The auxiliary carrier 11 can be removed, for example, after this step.

In accordance with FIG. 1E, the underside of the frame after the method step in accordance with FIG. 1D is shown. In this case, the auxiliary carrier 11 was removed at the underside of the frame. In this case, the side surfaces of the frame 8c which face the opening 9 are completely covered by the sacrificial layer 10, for example. In addition, the side surfaces of the sacrificial layer 10c, at the side facing the opening 9, are completely covered with the reflective layer 5. In this case, the sacrificial layer 10 is in direct and immediate contact with the side surfaces of the frame 8c which face the opening 9. Furthermore, the side surfaces of the reflective layer 5c which face away from the opening 9 are in direct and immediate contact with the side surfaces of the sacrificial layer 10c which face the opening 9. The bottom surfaces of the frame 8b, the bottom surface of the sacrificial layer 10b and the bottom surface of the reflective layer 5b terminate flush, for example.

In accordance with FIG. 1F, in a next method step, a conversion material 4 is introduced into the openings 9. In this case, a further auxiliary carrier 13 can be arranged on the underside of the frame. That is to say that the conversion material 4 completely fills the openings 9 and completely covers the bottom surfaces of the openings and the side surfaces of the openings 9c. In this case, a top surface of the conversion material 4a terminates flush with a top surface of the reflective layer 5a.

In accordance with FIG. 1G, in a next method step, the sacrificial layer 10 and the frame 8 are removed. The sacrificial layer 10 can be removed by chemical etching, for example. This results in singulated conversion elements 2.

A method step for one exemplary embodiment of a production method for optoelectronic semiconductor components 1 described here is illustrated in association with FIG. 2.

In accordance with FIG. 2, before introducing the conversion material 4 in accordance with FIG. 1F, in each case a radiation-emitting semiconductor chip 3 is introduced into the openings. The frame 8 then surrounds the radiation-emitting semiconductor chips 3 in a framelike fashion. That is to say that the frame 8 completely encloses the optoelectronic semiconductor chips 3.

Before introducing the radiation-emitting semiconductor chip 3, for example, the frame 8 is positioned on a further auxiliary carrier 13. The further auxiliary carrier 13 can comprise a film at a top side, for example, said film forming adhesion forces. The radiation-emitting semiconductor chips 3 are then introduced into the openings 9 centrally, for example. The adhesion forces formed between the film and the radiation-emitting semiconductor chips 3, for example, promote adhesion between these two component parts. That is to say that the radiation-emitting semiconductor chips 3 are connected to the further auxiliary carrier 13 and cannot slip.

The next method steps are analogous to the method steps described in accordance with FIGS. 1F and 1G.

The schematic sectional illustration in FIG. 3 shows one exemplary embodiment of an optoelectronic semiconductor component 1 described here.

The optoelectronic semiconductor component 1 comprises for example at least one reflective layer 5, a conversion material 4 and a radiation-emitting semiconductor chip 3, consisting of a semiconductor body 6 and contact elements 7. A top surface and a bottom surface of the conversion material 4a and 4b terminate for example flush with respectively a top surface and a bottom surface of the reflective layer 5a and 5b. In this case, the radiation-emitting semiconductor chip 3 is embedded into the conversion material 4. That is to say that a top surface of the semiconductor body 6a is covered by the conversion material 4. The side surfaces of the semiconductor body 6c are likewise completely covered with the conversion material 4. In this case, the bottom surface of the conversion material 4b terminates flush with the bottom surface of the semiconductor body 6b. Furthermore, a top surface of the contact elements 7b terminates flush with the bottom surface of the conversion material 4b.

A side surface of the conversion material 4 facing away from the reflective layer 5 here is in direct and immediate contact with the at least one side surface of the semiconductor body 6c facing the reflective layer 5 and completely covers the latter. Furthermore, the conversion material 4 is for example in direct and immediate contact with the top surface of the semiconductor body 6a. The reflective layer 5 additionally has a constant thickness. Furthermore, the reflective layer 5 runs parallel to the side surfaces of the semiconductor body 6c in a vertical direction.

The schematic illustration in FIG. 4 shows one exemplary embodiment of a conversion element 2 described here.

The conversion element 2 comprises a conversion material 4 and a reflective layer 5, for example. The reflective layer 5 in this case completely surrounds the side surfaces of the conversion material 4c. In this case, a top surface of the conversion material 4a terminates flush with a top surface of the reflective layer 5a. In addition, a bottom surface of the conversion material 4b in this case terminates flush with a bottom surface of the reflective layer 5b. In this case, the reflective layer 5 and the conversion material 4 are in direct and immediate contact. Furthermore, the reflective layer 5 runs perpendicularly to a top surface and bottom surface of the conversion element 2 in a vertical direction.

The schematic sectional illustration in FIG. 5 shows one exemplary embodiment of an optoelectronic semiconductor component described here.

The optoelectronic semiconductor component 1 illustrated here has the same properties in accordance with the exemplary embodiment illustrated in FIG. 3. In addition, the outer surfaces of the reflective layer 5 have a chamfer. The outer surfaces run parallel here. The oblique outer surfaces of the reflective layer 5 run transversely with respect to a top surface of the semiconductor body 6a. The oblique outer surfaces here form an acute angle with the top surface of the semiconductor body 6a, for example. Here, too, the reflective layer 5 has a constant thickness since the oblique outer surfaces run parallel.

The optoelectronic semiconductor component 1 has a widening shape in the direction of a top surface of the optoelectronic semiconductor component 1a. That is to say that the cross-sectional area of the top surface of the optoelectronic semiconductor component 1a in lateral directions is larger than the cross-sectional area of the bottom surface of the optoelectronic semiconductor component 1b.

The schematic illustration in FIGS. 6A and 6B shows one exemplary embodiment of a conversion element 2 described here. The conversion elements 2 illustrated here have the same properties in accordance with the exemplary embodiment illustrated in FIG. 4.

The conversion element 2 in accordance with FIG. 6A has a widening shape in the direction of a top surface of the conversion element 2a. That is to say that the cross-sectional area of the top surface of the conversion element 2a in lateral directions is larger than the cross-sectional area of the bottom surface of the conversion element 2b. Improved coupling out of light can be achieved by means of this shape.

The conversion element 2 in accordance with FIG. 6B has a widening shape in the direction of a bottom surface of the conversion element 2b. That is to say that the cross-sectional area of the bottom surface of the conversion element 2b in lateral directions is larger than the cross-sectional area of the top surface of the conversion element 2a. A focused light emission characteristic can be achieved by means of this shape.

The schematic sectional illustration in FIG. 7 shows one exemplary embodiment of an optoelectronic semiconductor component described here.

In contrast to the exemplary embodiment in FIG. 3, the bottom surface of the conversion material 4b in this exemplary embodiment does not terminate flush with respectively the bottom surface of the reflective layer 5b and the bottom surface of the semiconductor body 6b. Rather, a further reflective layer 14 is arranged on the bottom surface of the conversion material 4b. The further reflective layer 14 terminates flush with the bottom surface of the reflective layer 5b and the bottom surface of the semiconductor body 6b.

The further reflective layer 14 is formed here for example from a matrix material, for example silicone, which is filled with light-reflecting particles, such as titanium oxide particles, for example.

By means of the further reflective layer 14, the electromagnetic primary radiation emerging from the side surfaces of the semiconductor body 6b in the direction of bottom surface 4b, 5b and 6b is reflected again and once again enters the conversion material 4. The remaining primary radiation is once again converted there. Furthermore, the primary radiation and secondary radiation are directed for example in the direction of the top surface of the semiconductor body 6a by means of the further reflective layer 14. This advantageously increases the coupling out of light.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

LIST OF REFERENCE SIGNS

1 Optoelectronic semiconductor component
1a Top surface of optoelectronic semiconductor component
1b Bottom surface of optoelectronic semiconductor component
2 Conversion element
2a Top surface of conversion element
2b Bottom surface of conversion element
3 Radiation-emitting semiconductor chip
4 Conversion material
4a Top surface of conversion material
4b Bottom surface of conversion material
4c Side surfaces of conversion material
5 Reflective layer
5a Top surface of reflective layer
5b Bottom surface of reflective layer
5c Side surface of reflective layer
6 Semiconductor body
6a Top surface of semiconductor body
6b Bottom surface of semiconductor body
6c Side surface of semiconductor body
7 Contact elements
7a Top surface of contact elements
8 Frame
8a Top surface of frame
8b Bottom surface of frame
8c Side surface of frame
9 Opening
9c Side surface of opening
10 Sacrificial layer
10b Bottom surface of sacrificial layer
10c Side surface of sacrificial layer
100 Material of the sacrificial layer
100a Top surface of material of the sacrificial layer
11 Auxiliary carrier
11b Bottom surface of auxiliary carrier
12 Cutout
13 Further auxiliary carrier
14 Further reflective layer

The invention claimed is:

1. A method for producing a conversion element, comprising:
   providing a frame having at least one opening,
   applying a sacrificial layer at least to a side surface of the at least one opening,
   applying a reflective layer to the sacrificial layer,
   introducing a conversion material into the at least one opening, wherein the conversion material covers the reflective layer,
   chemically etching the sacrificial layer to remove the sacrificial layer, and
   removing the fame, wherein the reflective layer terminates flush with a bottom surface and a top surface of the conversion material.

2. The method as claimed in the preceding claim, wherein the side surface of the at least one opening has a chamfer.

3. A method for producing an optoelectronic semiconductor component, wherein
   the method for producing the conversion element as claimed in claim 1 is carried out, and
   before introducing the conversion material, a radiation-emitting semiconductor chip is introduced into the at least one opening.

4. The method as claimed in the preceding claim, wherein the conversion material introduced partly surrounds the radiation-emitting semiconductor chip.

5. A method for producing a conversion element, which is able to be applied on a radiation-emitting semiconductor chip, comprising:
   providing a frame having at least one opening,
   applying a sacrificial layer at least to a side surface of the at least one opening,
   applying a reflective layer to the sacrificial layer,
   introducing a conversion material into the at least one opening, wherein the conversion material covers the reflective layer,
   chemically etching the sacrificial layer to remove the sacrificial layer, and
   removing the frame.

6. The method of claim 5, further comprising:
   introducing the radiation-emitting semiconductor chip into the at least one opening.

* * * * *